(12) United States Patent
Schremmer

(10) Patent No.: US 6,421,246 B1
(45) Date of Patent: *Jul. 16, 2002

(54) PC CARD THAT RECEIVES CHIP CARD

(75) Inventor: Andreas Michael Schremmer, Schorndorf (DE)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/664,980

(22) Filed: Sep. 18, 2000

(30) Foreign Application Priority Data

Oct. 1, 1999 (DE) .......................... 199 47 162

(51) Int. Cl.⁷ .............................. H05K 5/02; H05K 5/03
(52) U.S. Cl. .................. 361/737; 361/741; 361/756
(58) Field of Search .................. 361/787, 737, 361/801, 803, 741, 756, 802; 439/377, 380, 630, 382, 945; 235/380, 382

(56) References Cited

U.S. PATENT DOCUMENTS

| | | |
|---|---|---|
| 5,336,877 A | 8/1994 | Raab et al. |
| 5,877,488 A | 3/1999 | Klatt et al. |
| 6,075,706 A * | 6/2000 | Learmonth et al. .......... 361/737 |

FOREIGN PATENT DOCUMENTS

| | | |
|---|---|---|
| EP | 0 893 777 | 7/1997 |
| GB | 2 299 192 | 3/1995 |

* cited by examiner

Primary Examiner—Jayprakash N. Gandhi
Assistant Examiner—Dameon E. Levi
(74) Attorney, Agent, or Firm—Roger C. Turner

(57) ABSTRACT

A PC card has an opening (24) in its upper sheet metal cover part for receiving a chip card (20), with a chip card guide (22) provided for guiding movement of an inserted chip card through the opening. The guide has a U-shaped upward projection (31) that lies in the opening against the rear and opposite sides of the opening. The guide has a ramp wall (32) lying under the opening to guide the leading edge of an inserted chip card. The guide is formed of a molded polymer with an upwardly-facing surface location (70) that is bonded facewise to the lower face of the sheet metal at a location immediately around the opening therein. The inserted card is stopped at a position where a portion of the chip card lies directly in the opening.

10 Claims, 4 Drawing Sheets

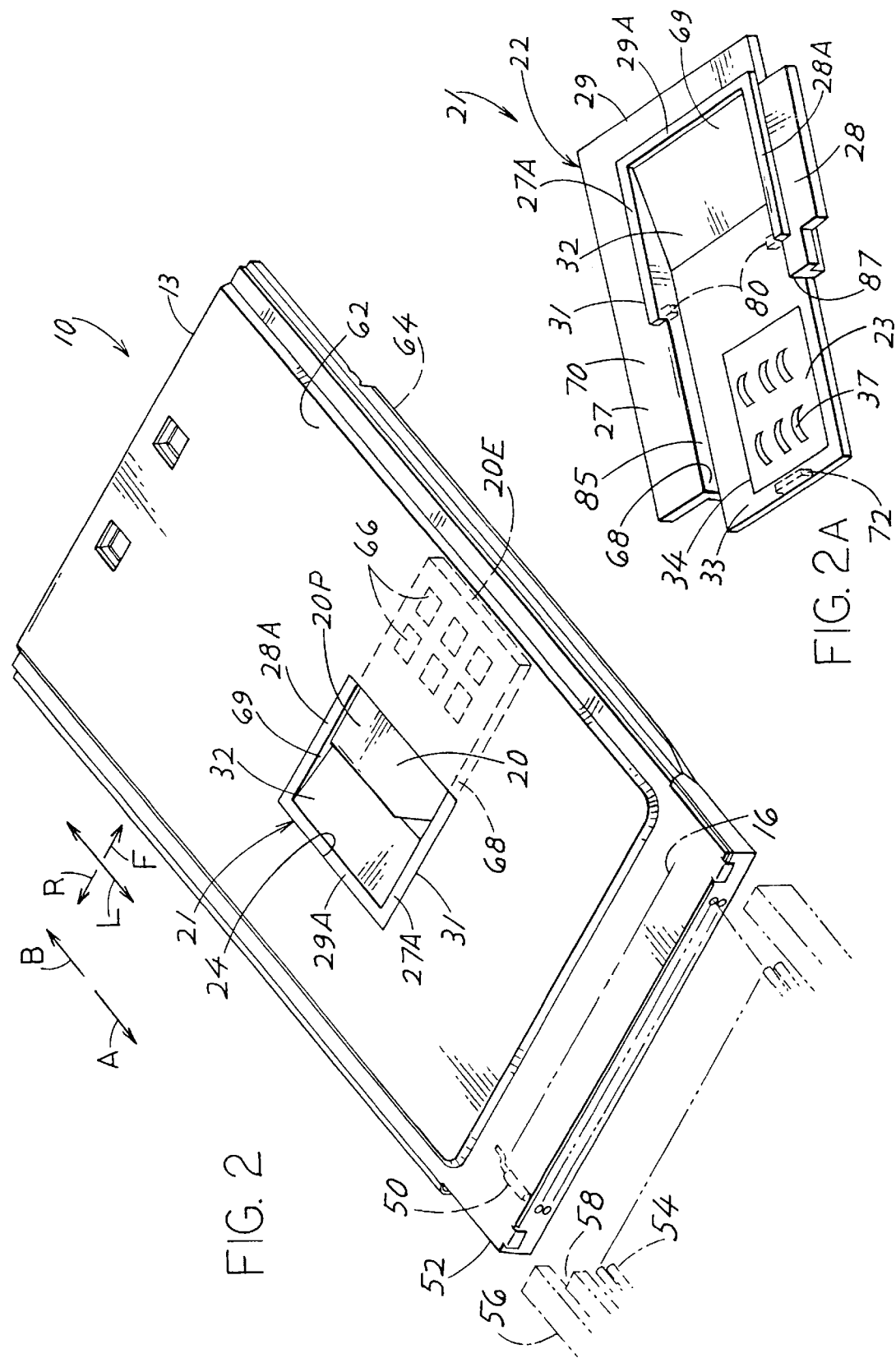

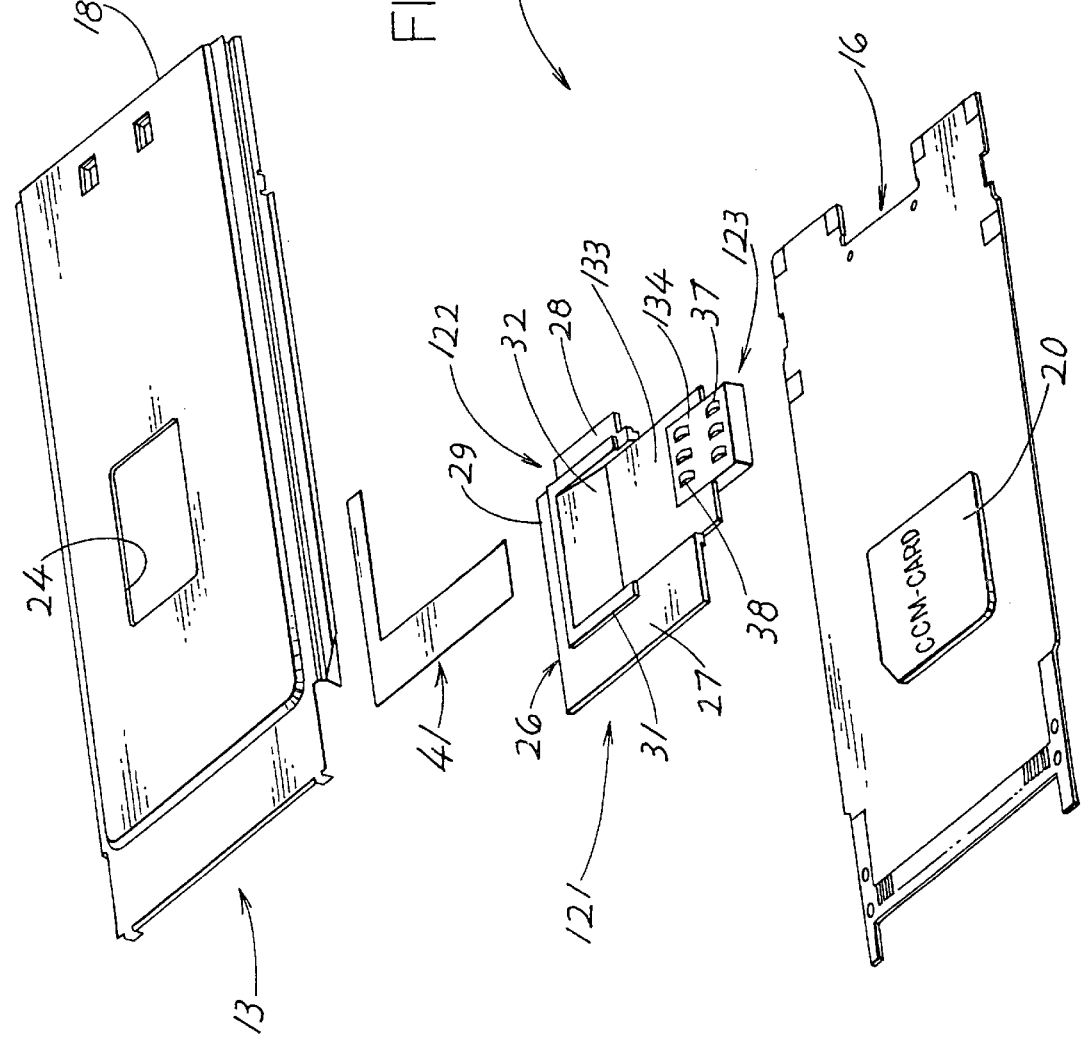

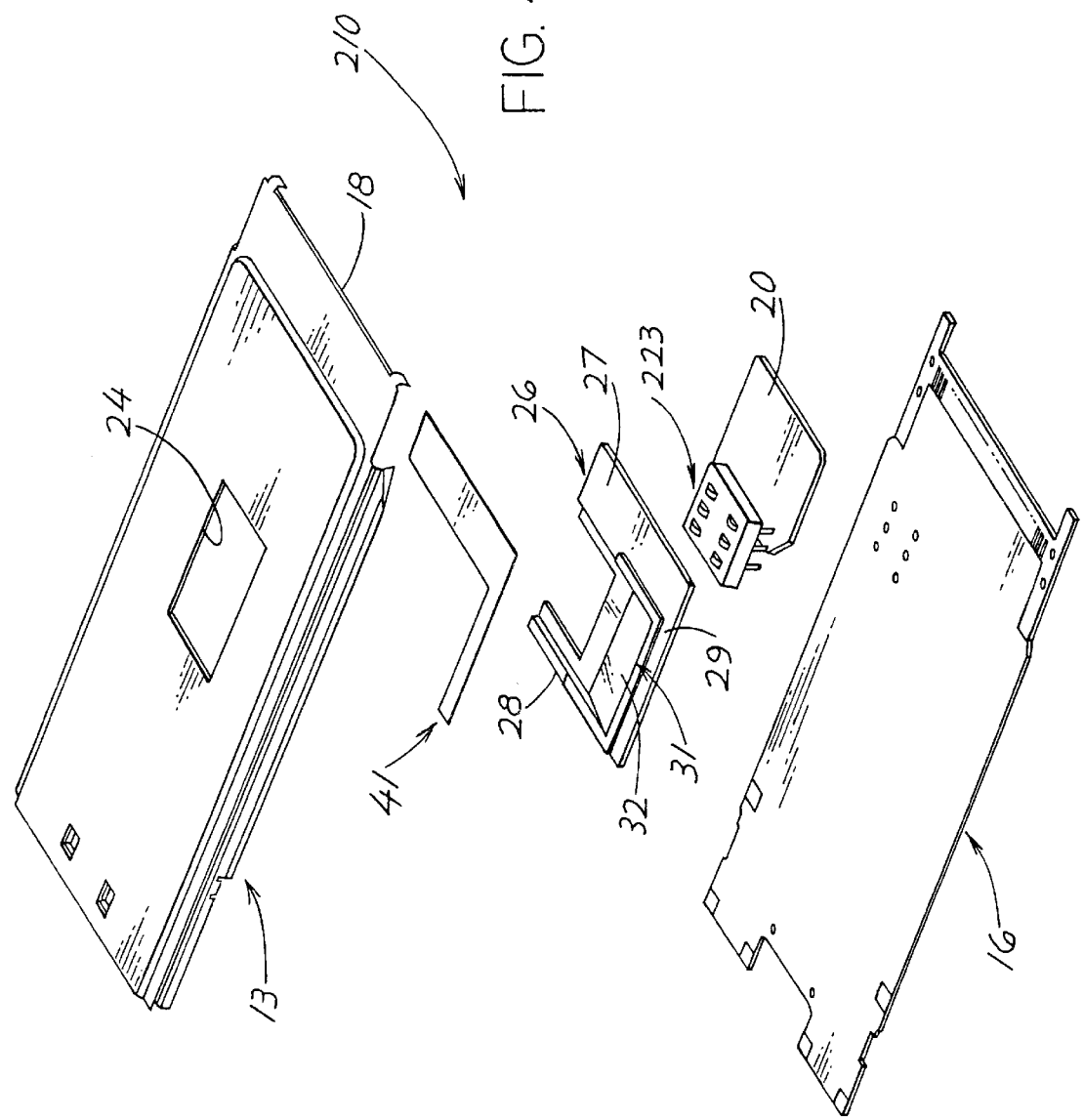

PC CARD THAT RECEIVES CHIP CARD

CROSS-REFERENCE

This application claims priority from German patent application 19947162.2 filed Oct. 1, 1999.

BACKGROUND OF THE INVENTION

PC cards, or plug-in cards, constructed in accordance with PCMCIA (Personal Computer Memory Card Industry Association) have a width and length of 54 mm×85.6 mm which is about the same as a common credit card. The most popular type of such card has a middle with a thickness of 5 mm. Such cards are inserted in electronic equipment such as portable computers to carry or transfer data. Another type of widely used card is a chip card, such as a SIM or CCM card, which has a width and length that are each less than half the width and length of the PC card and which have a thickness of about 0.8 mm. Such chip cards are often provided to authorize use of electrical equipment such as a portable computer, a mobile telephone, etc.

The reading of a chip card can be accomplished by inserted it into a special PC card and then plugging the PC card into a slot in the electrical equipment that is designed to receive the PC card. One type of special PC card includes a slot in the side of the PC card, which can weaken the side beams that support the card. My earlier U.S. Pat. No. 6,075,706 provides an opening in the upper sheet metal cover part into which the chip card can be laid, and with a lid that can be slid over the chip card. An even simpler PC card that could receive and read a chip card, would be of value.

SUMMARY OF THE INVENTION

In accordance with one embodiment of the present invention, a PC card is provided with an opening in its upper sheet metal cover part to receive a chip card, which enables very simple insertion and removal of the chip card. A chip card guide includes at least opposite legs lying along opposite sides of the opening, and preferably with a rear leg lying at the rear of the opening, to help guide the card through the opening. The guide also forms a ramp on which the leading edge of the chip card can be placed while inserting it through the opening. The guide provides a narrow slot at the front end of the opening, between the guide and the upper cover part. When the chip card is fully inserted against a stop, the contact pads of the chip card lie away from the opening and engage contacts on a contact block.

The novel features of the invention are set forth with particularity in the appended claims. The invention will be best understood from the following description when read in conjunction with the accompanying drawings.

BRIEF DESCRIPTION OF THE DRAWINGS

FIG. 2 is an isometric view of the assembled PC card of FIG. 1, shown during its insertion into a slot of electrical equipment.

FIG. 2A is an isometric view of the chip card guide of the PC card of FIG. 2.

FIG. 3 is an exploded isometric view of a portion of a PC card with a chip card guide of another embodiment of the invention.

FIG. 4 is an exploded isometric view of a portion of a PC card with a chip card guide of another embodiment of the invention.

DESCRIPTION OF THE PREFERRED EMBODIMENTS

Figure 1:
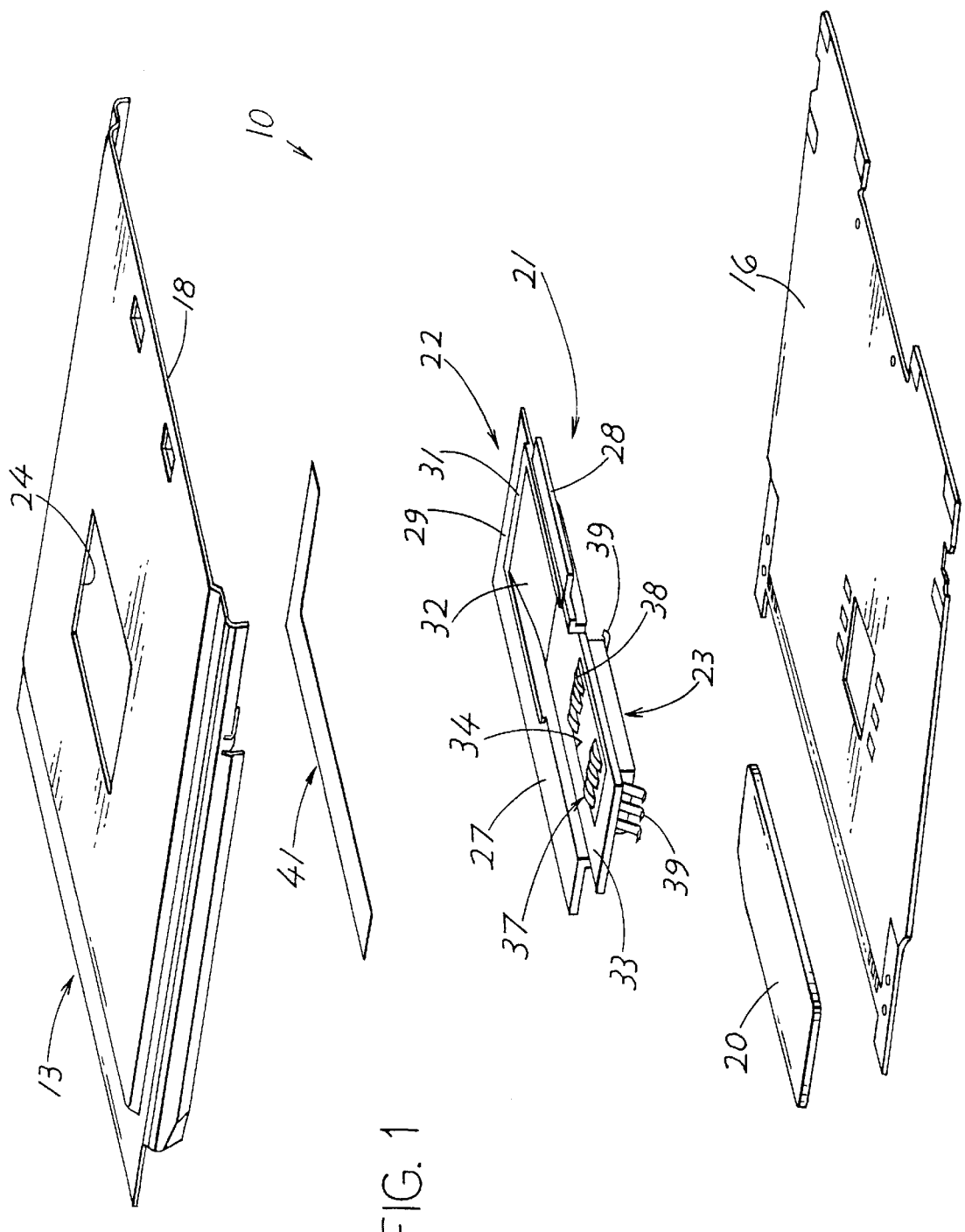
FIG. 1 is an exploded perspective view of parts of a PC card of one embodiment of the present invention.

FIG. 2 illustrates a plug-in or PC card 10 which has a connector with contacts 50 at an insertion end 52, for connection to contacts 54 of electronic equipment 56. The PC card is inserted in the direction A into a slot 58 where the contacts 54 lie at the end of the slot, and is withdrawn by pulling it out of the slot in a direction B. The PC card has a sheet metal cover 13 with upper and lower largely planar horizontal sheet metal cover parts 62, 64 and largely vertical sides that lock together. A circuit board 16 lies between the upper and lower cover parts. A chip card 20 with contact pads 66 on its lower surface, can be inserted through an entrance 69 in a rectangular opening 24 in the upper cover part 62 and into a chip slot 68 formed between the circuit board and the top cover part 62. A chip card guide assembly 21 is provided to help guide the chip card into its fully inserted position shown in FIG. 2, where only a portion 82 of the chip card still lies in the entrance.

As shown in FIGS. 2 and 2A, the chip guide assembly 21 includes a chip guide 22 that is molded of a dielectric polymer, with a plate 33 that lies on the circuit board and that has a hole 34 for holding a contact device 23 with multiple contacts 37.

The chip card guide has legs 27, 28, 29 with upwardly-facing surfaces 70 that lie against the lower face of the upper cover part 62. The guide also has a U-shaped projection 31 that fits into the opening 24 (FIG. 2) in the upper cover part and that forms much of the entrance 69. Laterally L opposite sides 27A, 28A of the projection provide plastic guides for low friction guiding of the sides of the chip card 20. The rear leg 29A can support the bottom of the chip card as it is slid into the slot 68 to protect the contact pads 66 on the lower surface of the chip card.

The guide 22 has a ramp wall 32 that extends at a downward and forward F incline of less than 45° and preferably about 15° to 20° from the horizontal. To insert the chip card, its leading edge 20E is laid on the ramp 32 between the opposite sides 27A, 28A, and the chip card is laid on the ramp and pushed forwardly. When the chip card is fully inserted, it hits a stop 72 which can be formed on the chip guide, on the circuit board, or on part of the overall frame or housing of the PC card. The rear edge of the chip card then lies at about the front end of the ramp.

FIG. 1 shows that the contact device 23 which lies in the hole 34 of the chip guide, has a plurality of contacts 37. The contact device 23 includes a block 39 of molded plastic, with the contacts 37 molded in the block. The block 39 is thicker than the plate 33 of the guide, and the block can lie in a hole in the circuit board. The block can lie in a press fit in the hole in the guide plate. It is possible to form the block integral with the guide. FIG. 1 also shows an adhesive strip 41 which includes a plastic film with contact adhesive on its opposite faces. The strip is laid on the surface 70 (FIG. 2A) so its lower layer of adhesive adheres to the guide, and the guide is then pressed upwardly so the surface 70 presses (through the adhesive strip) against the lower surface 18 of the sheet metal upper cover part. It is possible to use a U-shaped double layer of contact adhesive. The contacts 37 (FIG. 1) have tails 39 that are connected to traces on the circuit board, as by surface mount soldering or even insertion into plated holes. The contacts have pad-engaging ends 38 that engage the contact pads on the chip card.

FIG. 2A shows, in phantom lines, short front edge protectors 80 which can be used to lie against the under side of the upper cover part, at the front edge of the opening, to avoid scraping of the top of the chip card as it is inserted. However, the protectors should be about as thin as the sheet metal of the upper cover part to avoid substantial additional height.

When the chip card has been fully inserted, as shown in FIG. 2, the rear portion 82 of the card, which is about one-fourth of its length, still lies within the rectangular entrance 69. This portion 82 can be gripped, as by frictional engagement with a fingertip, for removal by rearward R movement up the ramp 32 and out of the PC card. It is also possible to provide a thin slot where a pencil tip can be inserted to push rearwardly against the rear edge 20E of the chip card. Much of the inserted chip card lies in the slot 68 that is formed between the wall 33 and the upper sheet metal cover part, and between opposite slot side walls 85, 87.

FIG. 3 illustrates a PC card 110 of another embodiment of the invention, where the guide plate 133 of the chip guide 122 has a cutout or hole 134 that is open at its free front end. The contact device 123 fits into the hole 134, which can be by a press fit or adhesion, or even a loose fit, and may lie also in a circuit board hole. Otherwise, the chip guide 122 is similar to the chip guide of FIGS. 1–2A.

FIG. 4 shows a PC card 210 which is similar to that of FIGS. 1–3, except that the contact device 223 has contacts with pin-like tails that project into plated-through holes in the circuit board instead of being surface mounted.

Thus, the invention provides a PC card which can receive a chip card and connect to contact pads of the chip card, which is of simple construction and operation. The PC card includes a molded polymer chip card guide for guiding movement of a chip card to a fully inserted position. The upper sheet metal cover part has an opening that receives the chip card, and the chip card guide guides the chip card along a chip slot lying parallel to the plane of the upper cover part but immediately below it, until contacts engage pads on the chip card. The chip card guide includes walls on opposite sides of the opening and preferably at the rear of the opening so the chip card is guided by a plastic surface instead of the edge of a sheet metal surface as it is inserted. The opposite side walls in the opening merge with side walls in the chip card slot. The chip guide forms a ramp along which the leading edge of the card can move during its insertion. A stop means that limits the card to its fully inserted position, positions the chip card with its front end still lying in the opening for easy removal.

Although particular embodiments of the invention have been described and illustrated herein, it is recognized that modifications and variations may readily occur to those skilled in the art, and consequently, it is intended that the claims be interpreted to cover such modifications and equivalents.

What is claimed is:

1. A PC card for insertion into electronic equipment, where the PC card has largely planar sheet metal upper and lower cover parts, has a circuit board lying between said cover parts, and has a PC card insertion end with contacts, where the upper cover part has an opening with opposite sides spaced in a lateral direction for receiving a chip card inserted along a forward direction that is perpendicular to said lateral direction where the chip card has a smaller width, length, and thickness than the width, length and thickness of the PC card, and where the PC card has a plurality of contacts with tail ends connected to traces on the circuit board and pad-engaging ends for engaging contact pads on the chip card, comprising:

a chip card guide for guiding movement of a chip card inserted forwardly through said opening to a fully inserted position where the chip pads engage the pad-engaging ends of the contacts said guide being fixed with respect to said sheet metal upper part and having a pair of legs lying along said opposite sides of said opening.

2. The PC card described in claim 1 wherein:

said chip card guide has a ramp wall lying under said opening, and extending at a forward and downward incline to guide the leading edge of a chip card that is initially inserted through said opening, along a downward incline that guides the chip card leading edge under the upper cover part.

3. The PC card described in claim 1 wherein:

said sheet metal upper cover part has a lower face, and said chip card guide has flat upwardly-facing locations that lie facewise against said lower face at a location immediately around said opening, with said legs projecting upwardly from said locations.

4. The PC card described in claim 3 wherein:

said flat upwardly-facing locations of said guide are facewise bonded to said lower face of said upper cover part.

5. The PC card described in claim 1 wherein:

said guide is formed of a polymer and has a rear end that lies in said opening at a rear end of the opening to protect the contact pads on a lower face of the chip card.

6. A PC card for insertion into electronic equipment, where the PC card has largely planar sheet metal upper and lower cover parts and a circuit board lying between said cover parts, where the upper cover part has an opening with opposite sides spaced in a lateral direction for receiving a chip card inserted in a forward direction that is perpendicular to said lateral direction, where the PC card includes a plurality of contacts with tail ends connected to traces on the circuit board and pad-engaging ends for engaging contact pads on the fully inserted chip card, comprising:

a chip card guide for guiding movement of the chip card where it is inserted through said opening to a position where the contact pads engage the pad-engaging ends of the contacts, said guide having an inclined wall fixed with respect to said circuit board and said sheet metal upper cover part and forming a ramp that lies directly under said opening and that is inclined downwardly and forwardly toward said contact pad-engaging ends, with said guide forming walls of a slot extending forwardly from said opening to said contacts.

7. The PC card described in claim 6 wherein:

said chip card guide is molded of a polymer, with said ramp extending at a downward-forward incline of less than 45°, with said chip card being fully inserted and with a rear portion of said chip card lying in said opening.

8. The PC card said ramp has a lower end lying in said opening, and said chip card has a rear edge lying at the bottom of said ramp.

9. A PC card for insertion into electronic equipment, where the PC card has largely planar sheet metal upper and lower cover parts, a circuit board lying between said cover parts, and a PC card insertion end with contacts, where the upper cover part has an opening with opposite sides spaced in a first direction for receiving a chip card inserted along a second direction that is perpendicular to said first direction, and where said PC card has a plurality of contacts with tail ends connected to traces on the circuit board and pad-engaging ends for engaging contact pads on the chip card, comprising:

a chip card guide for guiding movement of a chip card inserted forwardly through said opening to a fully inserted position where the chip pads engage the pad-engaging ends of the contacts, and means for stopping said chip card at said fully inserted position;

said means for stopping being positioned so at least a portion of said chip card lies directly in said opening and is exposed in said fully inserted position, and with said opening being uncovered so a person can press directly against the exposed portion of the chip card without manipulating any cover.

10. The PC card described in claim 9 wherein:

said opening is rectangular and said guide has an upwardly facing location that lies substantially face-wise against a lower face of said upper cover part adjacent to said opening, and said guide has an upwardly extending projection that projects into said opening at edges of said opening.

* * * * *